United States Patent [19]
Freerks

[11] Patent Number: 5,579,718
[45] Date of Patent: Dec. 3, 1996

[54] SLIT VALVE DOOR

[75] Inventor: Fred Freerks, Cupertino, Calif.

[73] Assignee: Applied Materials, Inc., Santa Clara, Calif.

[21] Appl. No.: 414,420

[22] Filed: Mar. 31, 1995

[51] Int. Cl.$^6$ ..................... C23C 16/00
[52] U.S. Cl. .............. 118/733; 251/328; 220/378
[58] Field of Search .................. 220/344, 241, 220/242, 358, 260, 295, 304, 378, 231, 327, 328; 49/482.1, 489.1, 490.1; 414/221, 939; 118/733; 251/328, 193

[56] References Cited

U.S. PATENT DOCUMENTS

| 2,870,987 | 1/1959 | Greenwood | 251/327 |
|---|---|---|---|
| 3,000,610 | 9/1961 | Bryant | 251/327 |
| 4,239,124 | 12/1980 | Inouye | 220/240 |
| 4,376,526 | 3/1983 | Freeman | 251/328 |
| 4,721,282 | 1/1988 | Shawver | 251/62 |
| 4,753,417 | 6/1988 | Madocks | 251/158 |
| 4,785,962 | 11/1988 | Toshima | 220/260 |
| 5,002,255 | 3/1991 | Sawa | 251/193 |
| 5,013,009 | 5/1991 | Nelson | 251/357 |
| 5,120,019 | 6/1992 | Davis | 251/193 |
| 5,150,882 | 9/1992 | Kaneko | 251/193 |
| 5,188,402 | 2/1993 | Colgate | 285/332 |
| 5,226,632 | 7/1993 | Tepman | 251/335.3 |
| 5,236,345 | 8/1993 | Nevrekar | 251/197 |
| 5,271,602 | 12/1993 | Funaba | 251/335.3 |
| 5,275,303 | 1/1994 | Szalai | 220/264 |
| 5,341,835 | 8/1994 | Lanning, II | 137/246.22 |
| 5,363,872 | 11/1994 | Lorimer | 137/1 |
| 5,379,984 | 1/1995 | Coad | 251/298 |

FOREIGN PATENT DOCUMENTS 58252  3/1986  Japan ..................... 414/939

Primary Examiner—Robert Kunemund
Assistant Examiner—Jeffrie R. Lund
Attorney, Agent, or Firm—Craig P. Opperman; Leslie Weise

[57] ABSTRACT

An improved slit valve door for sealing an aperture in the wall of a semiconductor process chamber. The slit valve door consists of an aperture cover plate with a recess in it for receiving a removable insert. An O-ring seal is placed over the insert, and when the insert is placed in the recess of the aperture cover plate, the O-ring moves into an O-ring seat in the aperture cover plate. As the insert seats in the recess and is secured to the cover plate by means of screws protruding from the floor of the recess, a dovetail groove is formed which retains the O-ring.

23 Claims, 6 Drawing Sheets

SLIT VALVE DOOR

BACKGROUND OF THE INVENTION

1. Field of the Invention

This invention relates to improvements to a vaccum processing chamber used in semiconductor manufacturing. More particularly, it relates to an improved slit valve door for sealing apertures formed in the walls of such a chamber.

2. Background

During the manufacture of semiconductors, it is necessary to deposit or etch layers of various materials on a semiconductor wafer. This is typically done in a deposition or etch chamber of a processing apparatus, the operation of which is illustrated with reference to FIG. 1 of the accompanying drawings.

In a typical processing apparatus, a number of silicon wafers 10 are stacked in a wafer elevator 12. Individual wafers 14 are sequentially removed from the elevator by means of a robot arm 16 and inserted into a particular chamber 18 through an open aperture or slit 19, which is typically rectangular and barely accommodates the blade of the robot carrying the wafer 14.

In this figure, four independent chambers 18, 18.1, 18.2, and 18.3 are shown. Each chamber has its own slit, 19, 19.1, 19.2, and 19.3, respectively, and the robot arm 16 services all four chambers. Once the wafer 14 has been inserted into the chamber, the aperture 19 is closed by a mechanism generally referred to as a slit valve closure mechanism 20. For the sake of clarity, only one closure mechanism is illustrated. In practice, however, each slit 19, 19.1, 19.2, and 19.3 has its own closure mechanism. After the slit 19 is closed, the fabrication process commences, which typically involves pumping the chamber to a reduced pressure, or injecting a reactive processing gas into the chamber, or a combination thereof. Thus, the chamber must be environmentally isolated and the slits must be vacuum sealable. Once the process has been completed, the closure mechanism 20 is operated to open the slit 19. The wafer 14 is then removed from the chamber 18 by the robot arm 16 and inserted into another processing chamber 18.1 or returned to the rack 12.

FIG. 2 illustrates one possible mechanism for opening and closing the slit valve door 21. Other mechanisms do, however, exist. Two examples are described in U.S. Pat. No. 5,275,303, the disclosures of which are incorporated herein by reference. The closure mechanisms 20 shown in FIGS. 2 and 2A includes a slit valve door 21, which comprises an aperture cover plate 22 and a seal 30. The closure means, as illustrated, in FIG. 2 appears to have only one linkage 28. This is as a result of the particular view depicted and it is usual for the closure means to include at least two identical and parallel linkages respectively positioned at the opposite ends of the slit valve door 21. However, the linkage 28 in FIG. 2A may be a pneumatically actuated rod.

In FIG. 2, the slit valve door 21 is shown to close and seal an aperture 19 in the sidewall 24 of the semiconductor reaction chamber 18. The linkage 28, in cooperation with unillustrated pivots, moves the door 21 from an open position 21' (shown in broken lines) 21' away from the chamber sidewall 24 to the sealing position shown by the position of the door 21. To enhance the seal between the door 21 and the wall 24 of the chamber, a circumferential O-ring 30 is fitted into a groove 40 in the face 26 of the door 21. Typically, this O-ring is made of a resilient, compressible, and heat-resistant material. Most commercial O-rings are composed of an elastomeric material.

As illustrated in FIG. 3, the O-ring 30 is typically retained in a dovetail groove 40 formed in the wall-facing face 26 of the door 21. The O-ring 30 is press-fitted into the groove 40. As can be seen from the illustration, the side surfaces 42 of the groove 40 slope inwardly up toward the face 26 to form a restriction 46 at the face 26. This restriction is narrower than the diameter of the O-ring 30. Once the O-ring 30 has been pressed past the restriction 46, it is retained between the restriction 46 and the bottom surface 44 of the groove 40.

It is well known in the semiconductor manufacturing industry that during processing, contamination of the interior atmosphere of the chamber must be kept to a minimum, as such contamination is detrimental to deposition and related procedures, as well as to the integrity of the semiconductor wafer produced. The O-ring seal is intended to prevent the leakage of process gases through the slit 19 out of the process chamber and to prevent atmosphere from entering, thus reducing contamination therefrom.

Unfortunately, the prior art device described above does not seal the slit 19 as well as might be desired. Because the restriction 46 is narrower than the O-ring 30, the O-ring 30 must be forced past the restriction 46. This can damage the sealing surfaces of the O-ring 30, resulting in leakage of gases into or out of the reaction chamber. The O-ring 30 may also twist during insertion or be unevenly tensioned after insertion. In either case, the O-ring 30 does not have a uniform dimension and does not seat properly in the dovetail groove 40. This results in poor performance and short life, as well as a less effective seal.

Another problem is illustrated in FIGS. 4 and 4a, which is a plan view onto the relevant portion of the face 26 of a prior art slit valve door with a dovetail groove 40. This groove 40 is typically machined into the door by a router with a dovetail bit. The dovetail groove 40 is narrower at its opening 41 than at its bottom surface 44, as indicated in FIG. 3. This makes the groove 40 difficult to machine in such a way that it is uniform along its entire length and such that it does not begin or terminate at an edge of the face 26. Although a uniformly dovetailed groove could be achieved by starting the groove 40 at an edge of the face 26, this is generally considered less ideal than starting the groove 40 by simply plunging the router bit into the face 26. The router bit then travels in a closed loop, cutting the dovetail groove 40, and terminates at its starting point. This procedure results in a hole 48 at the starting point that is wider than the opening 41 of the groove and whose width is that of the bottom surface 44 of the groove (shown in FIG. 3). In tile region of the hole 48, the restriction 46 of FIG. 3 does not exist and thus there is no retention of the O-ring 30 at that point. This adversely affects the sealing ability of the O-ring 30.

In order to facilitate the removal of the O-ring 30 from the dovetail groove 40 which retains it, a small groove 50 is cut in the face 26 such that it is orthogonal to the groove 40 and such that it has a lower surface even with the groove's bottom surface 44. This allows the O-ring 30 to be pried out by means of a small tool inserted in the small groove 50 below the O-ring 30. This creates two problems. First, the O-ring 30 is no longer supported by the sides 42 of the dovetail groove 40. Second, use of the small tool to remove the O-ring 30 may result in damage to the bottom 40 of the dovetail groove near the intersection with the small groove 50. Both of these difficulties reduce the effectiveness of the O-ring seal 30.

Therefore, the need has arisen for a means of sealing an aperture in the wall of a deposition chamber or the like which can provide a more effective seal and further reduce contamination of the interior of the process chamber, which has a longer life in order to reduce downtime for replacing the seal, and which would preferably be easily retrofitted to existing valve closure mechanisms with a minimum amount of labor.

SUMMARY OF THE INVENTION

In accordance with the present invention, there is provided an improved slit valve door for sealing an aperture in the wall of a semiconductor process chamber. The door includes an aperture cover plate, a removable insert which fits into a recess in the aperture cover plate, and an O-ring seal which is retained between the aperture cover plate and the insert. When the insert is fitted into the recess in the aperture cover plate, a generally uniform face is defined which, when the slit valve door is closed, faces the aperture in the wall.

The aperture cover plate has a recess for receiving the insert, along with an O-ring receiving seat defined by a shoulder and an inwardly angled wall. The insert has an angled face which, when the insert is received in the recess, combines with the shoulder and angled wall to define a dovetail groove that retains the O-ring seal between the cover plate and the insert. The insert is secured to the cover plate by means of screws which pass from the rear face of the cover plate into the recess and screw into the insert. An O-ring is placed over and held by the lower portion of the insert and the lower portion is then inserted into the recess. As the screws are tightened, the O-ring moves with the insert into the recess until it contacts the shoulder of the O-ring receiving seat, which prevents the O-ring from moving further into the recess. Further tightening of the screws causes the angled face of the insert to come into contact with the O-ring, and the angled face forces the O-ring into contact with the inwardly angled wall of the O-ring receiving seat. The O-ring is thus held in place by the shoulder, inwardly angled wall, and angled face. Part of it protrudes beyond the generally uniform face defined by the cover plate and insert, and when the slit valve door is closed, the protruding part of the O-ring comes in contact with the wall of the chamber.

Secondary O-ring seals are placed in grooves formed around the holes through which the screws pass, thus sealing the holes and helping to prevent leakage through the slit valve door itself. In an improvement to the invention, the O-ring receiving seat has a radiused corner between the shoulder and inwardly angled wall. This radiused corner has the advantage of being easier to machine than a sharp corner having an acute angle. It reduces the volume of the pocket between the O-ring, shoulder, and inwardly angled wall, thus reducing the amount of air trapped in the pocket when the O-ring is received in the O-ring seat and reducing the vacuum which tends to hold the O-ring in place and makes removal more difficult.

One advantage of this invention is that the contamination of the chamber's interior is reduced by providing a more effective seal. This is achieved by reducing the twisting, uneven tensioning, and uneven placement of the O-ring as it is placed in the slit valve door.

Furthermore, the present invention facilitates removal of the O-ring seal and does not require use of a prying tool which could damage the surfaces of the slit valve door's retaining groove and thus reduce the effectiveness of the seal.

A further advantage of the present invention is that less stress is placed on the O-ring seal as it is inserted into the slit valve door, reducing the possibility of damage to the O-ring and thus increasing its life. This means the O-ring will not have to be replaced as frequently, which reduces the downtime for replacement of the O-ring.

Yet another advantage of the present invention is that it can be retrofitted to an existing processing apparatus to replace the prior art slit valve doors as illustrated in FIG. 2.

DESCRIPTION OF THE DRAWINGS

In the accompanying drawings.

DETAILED DESCRIPTION OF THE PREFERRED EMBODIMENT

Figure 1:
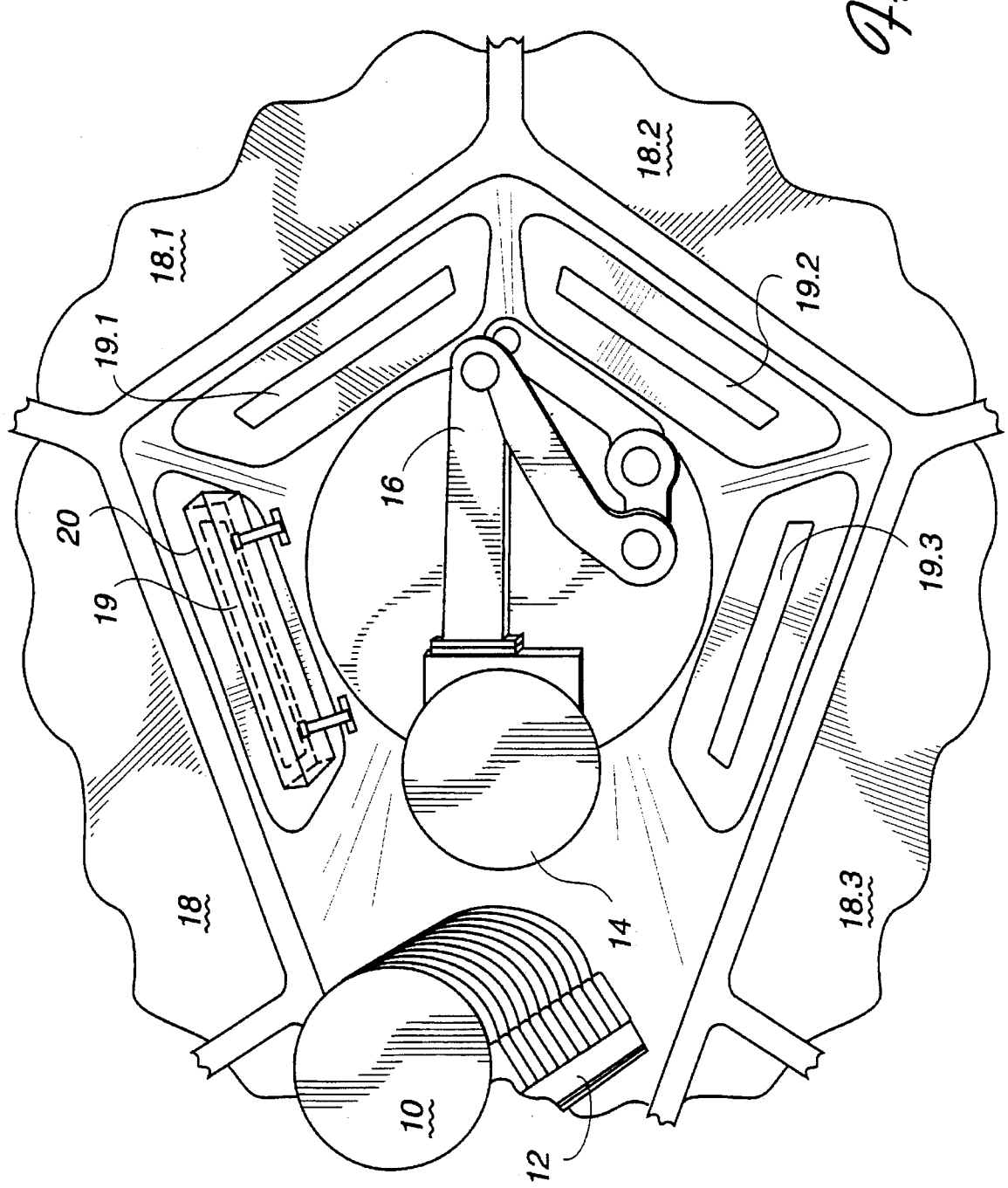
FIG. 1 is a pictorial view from above illustrating a semiconductor processing apparatus having four semiconductor reaction chambers.
Figure 2A:
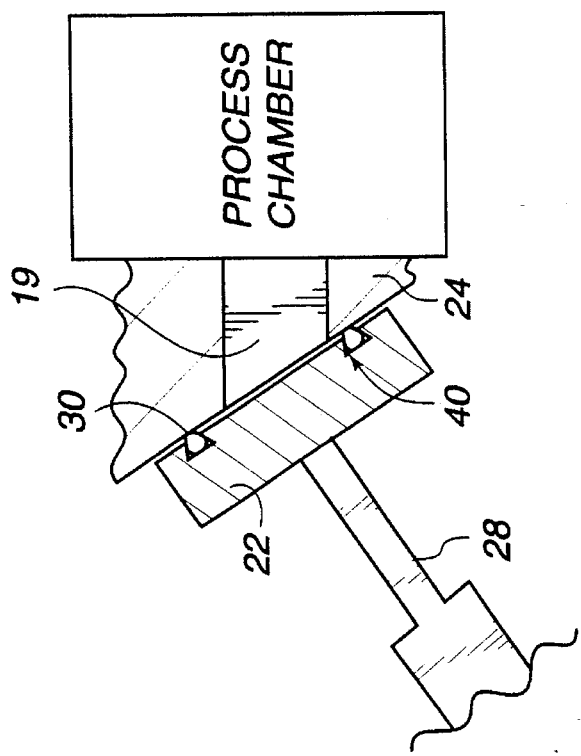
FIG. 2A is a side elevation view showing a slit valve door with an inline activation system for use in covering the aperture in the chamber wall.
Figure 2:
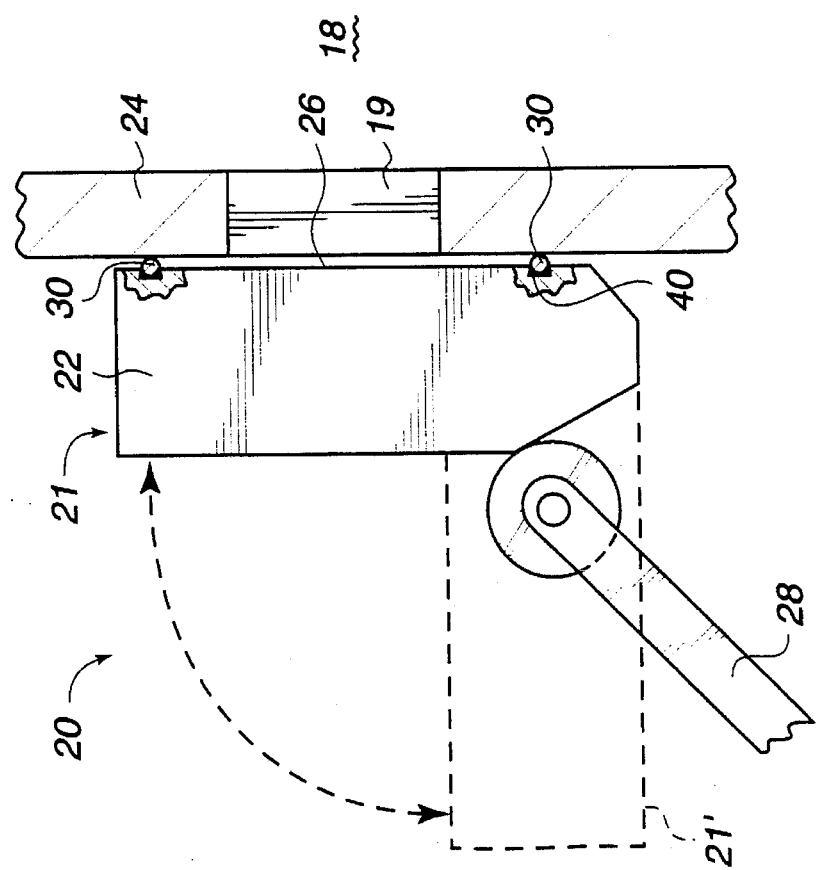
FIG. 2 is a side elevational view showing a slit valve door being used to cover an aperture in a reaction chamber wall.
Figure 3:
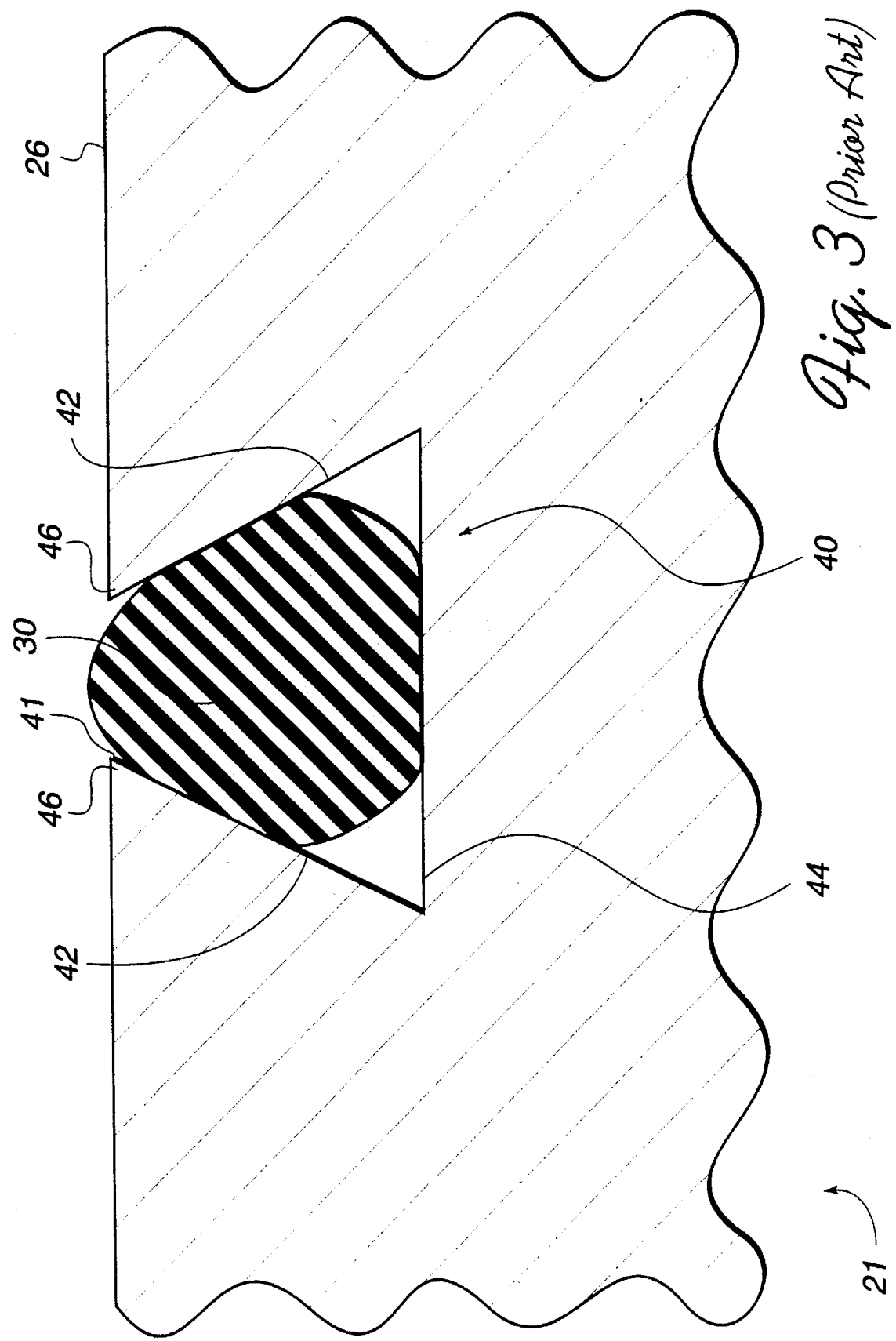
FIG. 3 is a detailed sectional view of a prior art slit valve door, showing a seal and means for retaining the seal.
Figure 4A:
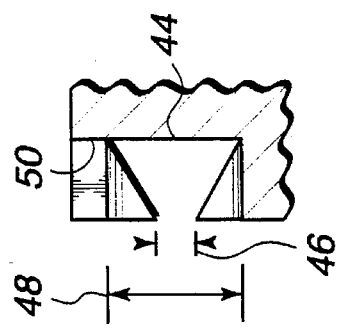
FIG. 4(a) is a cross-section along line 4—4 in FIG. 4.
Figure 4:
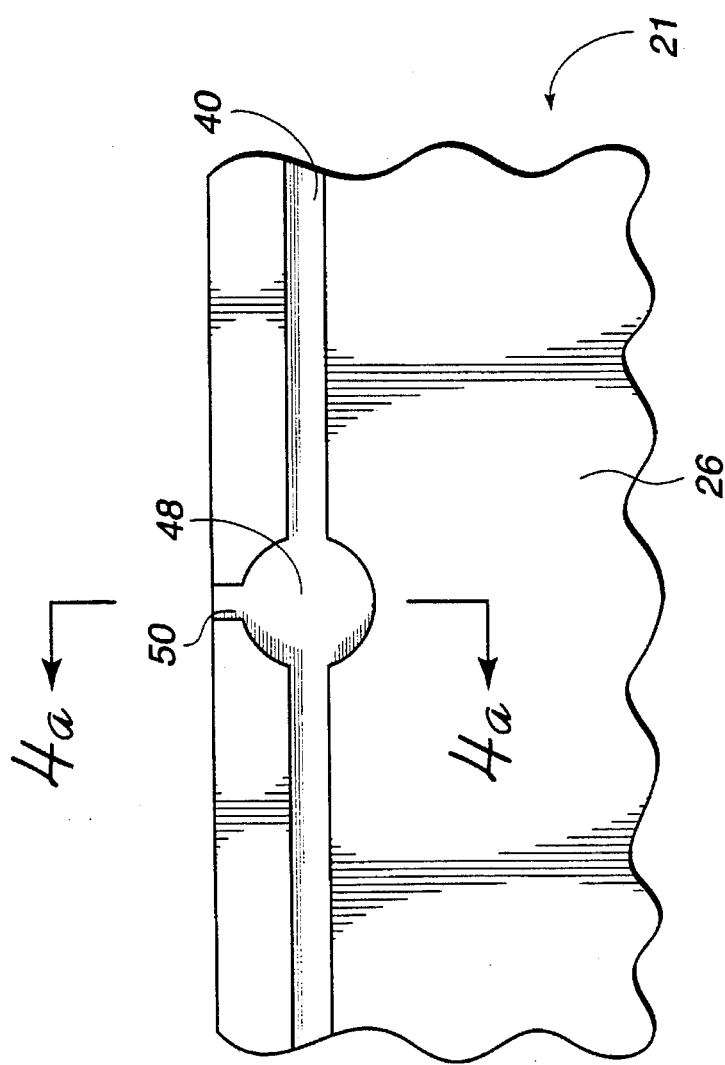
FIG. 4 is a section of a longitudinal view of the prior art slit valve door in FIG. 3 as well as a cross-section through the slit valve door.
Figure 5:
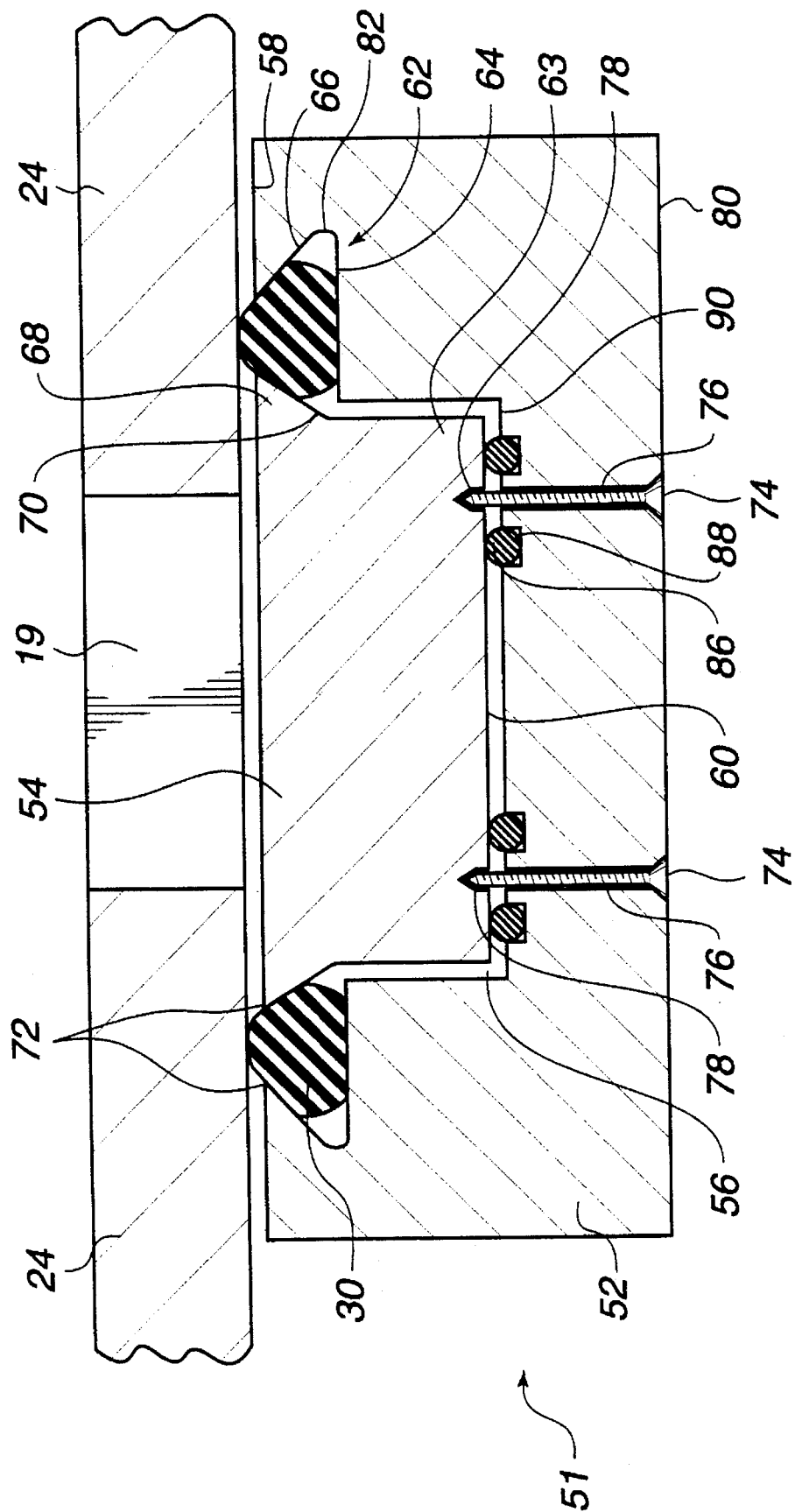
FIG. 5 is a longitudinal section of a slit valve door according to this invention, and shown covering an aperture in a reaction chamber.

In FIG. 5, a slit valve door retaining the O-ring 30 in accordance with the present invention is shown, and generally indicated as 51. As illustrated, it comprises a first part in the form of an aperture cover plate 52, often referred to as a door, in combination with a second part in the form of an insert 54. The cover plate 52 has a recess 56 formed in its face 58 for receiving the insert 54. The insert 54 has a seating surface 60 that adjoins the bottom surface 90 of the recess 56 when the cover plate 52 and insert 54 are combined. The cover plate 52 further includes an O-ring seat 62, including an inwardly angled wall 66 and a stepped formation which forms a shoulder 64 for supporting the O-ring 30. The included angle between the wall 66 and the shoulder 64 is typically 60–63 degrees. The wall 66 and the shoulder 64 define two of the three primary sides of a dovetail O-ring retainer. The insert 54 has an upper, protruding lip 68, including an angled surface 70, which is formed so that it overhangs the shoulder 64 when the insert 54 is received in the recess 56 and is inwardly angled with respect to the resultant dovetail groove. In this way, the third primary side of the dovetail O-ring retainer is defined.

To insert the O-ring 30, it is first placed over a lower portion 63 of the insert 54 before the insert 54 is lowered into the cover plate The lower portion 63 is sized such that the elastic O-ring 30 is held thereon under tension. The lower portion 63 of the insert 54 is then inserted into the recess 56 formed in the cover plate 52. As this occurs, the O-ring 30 first passes the tip of the cover plate wall 66 and then bears against the shoulder 64 and is prevented frown moving further into the recess 56. The insert 54, however, continues to be forced into the recess 56, causing the O-ring 30 to move up against, and thereafter, stretch over, the angled face 70. This also forces the O-ring 30 into the O-ring seat 62, such that the O-ring 30 comes into contact with the angled wall 66. At this point, the lower surface 60 of the insert 54 is near the bottom surface 90 of the recess 56. When the insert 54 is received in the recess 56 of the cover plate 52, the combination of the angled surface 70, the wall 66, and the shoulder 64, defines a dovetail shaped O-ring retainer, opening outwardly through a restriction 72, which serves to retain the O-ring 30. Little to no force is required for insertion of the O-ring seal 30, because the O-ring 30 is received in the O-ring seat 62 before the restriction 72 is formed by the combination of the insert 54 with the cover plate 52. This permits the O-ring 30 to be installed with uniform tension and avoids damage to the O-ring 30 that would result from forcing it past a restriction, thereby providing a better seal. Furthermore, it is trivial to remove and replace the O-ring seal 30.

The cover plate 52 has two symmetrically placed holes 76 extending from its rear face 80 into the recess 56. The insert 54 is joined to the cover plate 52 by means of screws 74, which pass through the holes 76 in the cover plate 52 and screw into holes 78 tapped into the seating surface 60 of the insert 54. By tightening the screws 74 appropriately, the top wall of the insert 54 is pulled into close proximity with the face 58 of the cover plate 52. As the screws 74 are tightened, the O-ring 30, which has been placed over the insert 54, is forced into contact with the shoulder 64. The shoulder 64 prevents further movement of the O-ring 30 into the recess 56 and forces the O-ring 30 up against the angled face 70. This pushes the O-ring 30 into contact with the wall 66. Further tightening of the screws 74 increases the compressive force on the O-ring 30 exerted by the angled surface 70, the wall 66, and the shoulder 64, and thus improves the sealing between the cover plate 52 and the insert 54.

An improvement to the invention comprises secondary seals 86 between the cover plate 52 and the insert 54. Grooves 88 are formed in the recess 56 such that they completely encircle the holes 76. Each secondary O-ring seal 86 is placed in a groove 88 and is dimensioned so that when it is placed in the groove 88, it protrudes above the bottom surface 90 of the recess 56. When the insert 54 is received in the recess 56 of the cover plate 52, the seating surface 60 comes into contact with the secondary O-ring seals 86, thus sealing the holes 74. This has the advantage of further preventing leakage of air between the cover plate 52 and insert 54. It is easy to insert and remove these secondary O-ring seals 86 in the present configuration of the slit valve door, as the insert 54 is easily removed to give access to the secondary O-ring seals 86. The ease of insertion reduces the possibility of damage to the O-ring seals 86, thereby providing a better seal.

Figure 6:
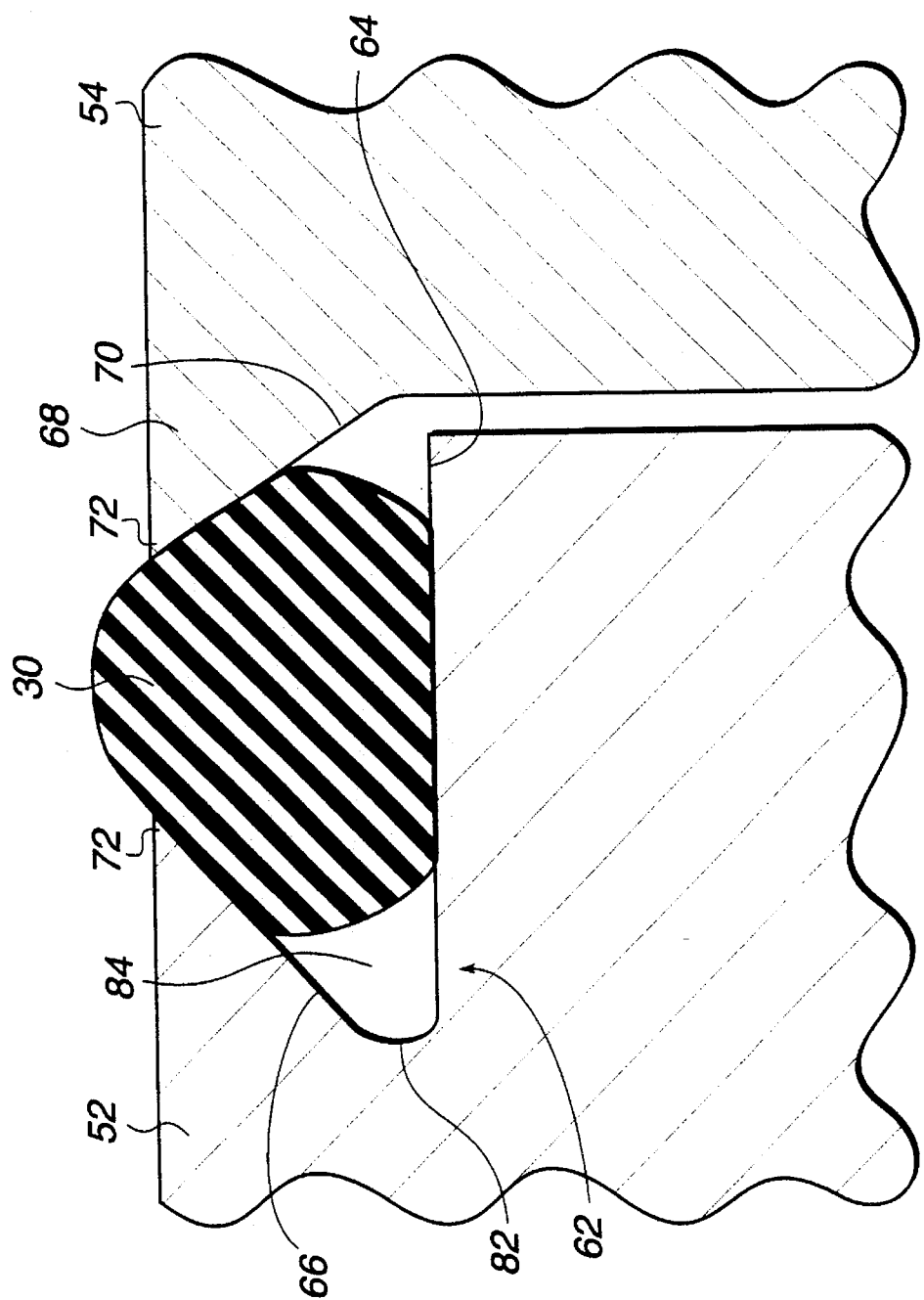
FIG. 6 is detailed sectional view of the slit valve door in FIG. 5, showing a primary seal and a means for retaining the primary seal.

A further improvement to the invention comprises a radiused corner 82 between the wall 66 and the shoulder 64, as shown in FIG. 6. The radiused corner 82 has the advantage of being easier to machine than a sharp corner having an acute angle. This feature also has the advantage of reducing the volume of trapped air in the pocket 84 defined between the O-ring 30, the shoulder 64, and the wall 66. This improves the sealing, because when the screws 74 are tightened to place the O-ring 30 under compression, the angled surface 70 forces the O-ring 30 further into the pocket 84 and reduces the volume of the pocket 84. The O-ring 30 is already in contact with the wall 66 and the shoulder 64, effectively sealing the pocket 84. The trapped air can escape, through strategically placed vents in the wall and shoulder as is a common practice in vacuum applications.

While the invention has been particularly shown and described with reference to a certain preferred embodiment, it will be understood by those skilled in the art that various alterations and modifications in form and in detail may be made therein. Accordingly, it is intended that the following claims cover all such alterations and modifications as nay fall within the true spirit and scope of the invention.

What is claimed is:

1. A door for sealing an aperture formed in a wall of a semiconductor reaction chamber, comprising:

(i) a primary seal for engaging the wall and sealing the aperture;

(ii) an aperture cover plate including at least a first and a second part, detachably fixed to one another and defining a seal retainer in which the primary seal is retained when the first and second parts are joined; and (iii) means for moving the primary seal into position the retainer as the first and second parts are joined.

2. The door as recited in claim 1, wherein the aperture cover plate includes a wall-facing face and the combination of the first and second parts defines the seal retainer, the seal retainer having side and bottom surfaces and art opening at the wall-facing face, for retaining the primary seal while allowing it to protrude, at least in part, beyond the wall-facing face.

3. The door as recited in claim 2, wherein the side surfaces in conjunction with the bottom surface define a restriction which retains a major portion of the seal.

4. The door as recited in claim 3, wherein an intersection between a side surface and the bottom surface is concave.

5. The door as recited in claim 2, wherein the first part includes a recess, having walls and being sized to receive the second part, and wherein the means for moving the primary seal is defined by a shoulder, formed in a wall of the recess.

6. The door as recited in claim 5, wherein the first and second parts each include a face for abutting an outer surface of the wall of the reaction chamber.

7. The door as recited in claim 6, wherein the respective faces of the first and second parts define the wall-facing face when the second part is received in the recess.

8. The door as recited in claim 5, wherein the shoulder defines a bottom surface of a generally trapezoidally shaped primary seal retainer when the second part is received in the recess.

9. The door as recited in claim 2, further comprising a secondary seal positioned between the first and second parts.

10. The door as recited in claim 9, wherein the recess includes side and bottom surfaces and the secondary seal is positioned at the bottom surface.

11. The door as recited in claim 10, wherein the bottom surface has a groove, for retaining the secondary seal, formed therein.

12. A semiconductor processing apparatus, comprising:

(i) at least a chamber wall, having an aperture formed therein and defining a thermal processing chamber;

(ii) a slit valve for sealing said aperture, said slit valve including (a) a door configured to cover said aperture and having a recess formed therein; and (b) an insert detachably receivable within said recess and configured to define, when fixed within said recess, a seal retainer; and (iii) a sealing member disposed within said retainer.

13. The apparatus as recited in claim 12 wherein said aperture is generally rectangular.

14. The apparatus as recited in claim 12, wherein said retainer has walls sloping inwardly toward said chamber wall.

15. The apparatus as recited in claim 14, wherein said door additionally comprises a shoulder generally parallel to said chamber wall and forming a portion of said groove.

16. The apparatus as recited in claim 15, wherein said sealing member comprises an elastomer.

17. The apparatus as recited in claim 14, wherein said door further comprises a projection insertable into said recess and around which said sealing member can be placed.

18. The apparatus as recited in claim 17, wherein said sealing member comprises an elastomer.

19. The apparatus as recited in claim 12, wherein said recess has a depth greater than a major cross-sectional dimension, taken through the sealing member in a direction substantially perpendicular to said chamber wall.

20. The apparatus as recited in claim 19, further comprising a seal engaging means positioned in the recess at a depth which is less than or equal to the major cross-sectional dimension.

21. The apparatus as recited in claim 20, wherein said seal engaging means is configured to engage and position said sealing member as said insert is received in said recess.

22. The apparatus as recited in claim 12, further comprising a slit valve door closure means, operable to move said door between a sealed position in which said sealing member seals said aperture, and a position spaced apart from said sealed position.

23. The apparatus as recited in claim 22, wherein said closure means is configured to move said door to said sealed position such that said sealing member engages said chamber wall in a substantially perpendicular manner.

* * * * *